(12) United States Patent
Kashiwakura

(10) Patent No.: US 9,433,094 B2
(45) Date of Patent: Aug. 30, 2016

(54) ELECTRONIC SUBSTRATE AND STRUCTURE FOR CONNECTOR CONNECTION THEREOF

(71) Applicant: NEC CORPORATION, Tokyo (JP)

(72) Inventor: Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/652,463

(22) PCT Filed: Dec. 11, 2013

(86) PCT No.: PCT/JP2013/007286
§ 371 (c)(1),
(2) Date: Jun. 16, 2015

(87) PCT Pub. No.: WO2014/097580
PCT Pub. Date: Jun. 26, 2014

(65) Prior Publication Data
US 2015/0340785 A1    Nov. 26, 2015

(30) Foreign Application Priority Data
Dec. 18, 2012  (JP) ................. 2012-275669

(51) Int. Cl.
*H05K 1/11*       (2006.01)
*H01R 13/6461*    (2011.01)
(Continued)

(52) U.S. Cl.
CPC .............. *H05K 1/117* (2013.01); *H01R 12/721* (2013.01); *H01R 13/6461* (2013.01);
(Continued)

(58) Field of Classification Search
CPC .... H01R 12/50; H01R 12/51; H01R 12/718; H01R 12/721; H01R 12/72; H01R 23/7068; H05K 1/117
See application file for complete search history.

(56) References Cited

U.S. PATENT DOCUMENTS 3,205,471 A * 9/1965 Herrmann .......... H01R 12/7082
                                                   439/136
3,706,065 A * 12/1972 Knitter et al. ....... H05K 3/3405
                                                    439/59
(Continued)

FOREIGN PATENT DOCUMENTS

JP    58-116791    7/1983
JP    59-104562    7/1984
(Continued)

OTHER PUBLICATIONS

International Search Report PCT/JP2013/007286 dated Mar. 11, 2014.

*Primary Examiner* — Gary Paumen
(74) *Attorney, Agent, or Firm* — Young & Thompson

(57) ABSTRACT

An electronic substrate 100 includes: a substrate member 110 which has a shape of plane plate and whose pair of main surfaces 110a and 110b are opposite each other; a plurality of connection terminals 130 which are formed so as to be arranged on an edge side of the substrate member 110 and on at least one surface out of the pair of main surfaces 110a and 110b of the substrate member 110; a plurality of wirings 120 which are connected with the plural connection terminals 130; and a plurality of openings 140A arranged in an area, which exists between connection terminals 130 adjacent each other out of the plural connection terminals 130 and in which the connection terminals 130 adjacent each other extend, in an extending direction of the connection terminals 130 adjacent each other.

2 Claims, 14 Drawing Sheets

B-B

(51) Int. Cl.
*H01R 13/6473* (2011.01)
*H01R 12/72* (2011.01)
*H01R 12/73* (2011.01)
*H05K 1/02* (2006.01)

(52) U.S. Cl.
CPC ......... *H01R 13/6473* (2013.01); *H05K 1/025* (2013.01); *H01R 12/73* (2013.01); *H05K 1/024* (2013.01); *H05K 2201/0191* (2013.01); *H05K 2201/09036* (2013.01); *H05K 2201/09709* (2013.01)

(56) References Cited

U.S. PATENT DOCUMENTS

| | | | | | |
|---|---|---|---|---|---|
| 5,270,964 | A | * | 12/1993 | Bechtolsheim | G11C 5/00 365/52 |
| 5,947,748 | A | * | 9/1999 | Licht | H01R 29/00 439/59 |
| 5,963,045 | A | * | 10/1999 | Zink | G01R 1/07342 324/750.16 |
| 6,296,499 | B1 | * | 10/2001 | Hermann, Jr. | H01R 13/03 439/181 |
| 6,425,766 | B1 | * | 7/2002 | Panella | H05K 1/117 439/59 |
| 7,422,445 | B2 | * | 9/2008 | Cheng | H01R 12/721 439/567 |
| 7,645,146 | B2 | * | 1/2010 | Lindkamp | H01R 12/721 439/79 |
| 7,916,486 | B2 | * | 3/2011 | Takahashi | H01R 12/592 361/720 |
| 8,313,341 | B1 | * | 11/2012 | Falk | H01R 24/64 327/538 |
| 8,641,453 | B2 | * | 2/2014 | Jung | H05K 1/117 439/637 |
| 8,708,710 | B2 | * | 4/2014 | Law | G01R 31/2818 439/60 |
| 8,777,635 | B1 | * | 7/2014 | Long | H01R 12/7088 439/60 |
| 8,982,567 | B2 | * | 3/2015 | Bang | G06K 7/0047 361/737 |

FOREIGN PATENT DOCUMENTS

| | | |
|---|---|---|
| JP | 63-105370 | 7/1988 |
| JP | 2002-094203 | 3/2002 |
| JP | 2005-026020 | 1/2005 |
| JP | 2010-103907 | 5/2010 |

* cited by examiner

A-A

B-B

EXAMPLE 1

ELECTRONIC SUBSTRATE AND STRUCTURE FOR CONNECTOR CONNECTION THEREOF

TECHNICAL FIELD

The present invention relates to an electronic substrate and the like, and, for example, relates to an electronic substrate, which has a plurality of connection terminals arranged on an edge of a substrate member, or the like.

BACKGROUND ART

Recently, an art to connect an electronic substrate, which has a shape of plane plate and at whose edge a connection terminal is arranged, and a connector electrically by inserting the electronic substrate into a slot of the connector is well-known.

The electronic substrate, which is used in the above-mentioned art, has structure shown, for example, in FIG. 13 and FIG. 14. A wiring 120, which is used as a signal line, is arranged on a substrate member 110 which has a shape of plane plate. The wiring 120 is connected with a connection terminal 130 which is arranged on an edge side of the substrate member 110. A transmission signal is transmitted from the wiring 120 to the connection terminal 130. Moreover, a signal in a reverse direction is transmitted from the connection terminal 130 to the wiring 120.

Meanwhile, the connection terminal 130, which is positioned at an edge of an electronic substrate 100a, has parasitic capacitance. Accordingly, there is a problem that capacitive coupling causes an impedance mismatch to generate crosstalk. Moreover, as a cycle of digital signal becomes short, influence caused by the cross talk becomes severe. Furthermore, as the parasitic capacitance of the connection terminal becomes large, the influence caused by the cross talk becomes severe.

Nowadays, a signal speed at a circuit interface or on a back plane becomes high to increase from 10 Gbps to several tens Gbps. Therefore, there is a situation that, since the signal speed becomes high and a frequency bandwidth of the signal becomes wide, the cross talk, which is generated not only at the wiring but also at the connection terminal by the impedance mismatch due to the parasitic capacitance, cannot be neglected.

With respect to the above-mentioned situation, PTL 1 describes an art that, by a configuration that a wiring side portion of a connection terminal and a stub portion of the connection terminal, which is positioned in an opposite direction of the wiring side portion, are discontinuous electrically, reflection noise generated from the stub, which is a surplus portion of the connection terminal, is restrained, and parasitic capacitance existing between the sub and the GND layer is reduced, and consequently the impedance mismatch is improved.

Here, while PTL 2 does not describe an art which is related to the impedance mismatch caused by the capacitive coupling, PLT 2 describes an art to reduce cross talk which is generated between terminals. That is, according to the art which is described in PTL 2, connection terminals are formed in a ditch, whose substrate edge is opened, in parallel. Moreover, a dielectric material, which is a part of the substrate member, intervenes between the connector terminals as a step having a convex shape. Furthermore, a connection terminal, which has the GND level electric potential, is arranged on the step and a through hole is arranged just under the connection terminal which has the GND level electric potential. PTL 2 describes an art that a shield effect by the above-mentioned structure reduces influence, which is caused by the electromagnetic field generated between the connection terminals, and restrains the cross talk.

CITATION LIST

Patent Literature

[PTL 1] Japanese Patent Application Laid-Open Publication No. 2010-103907
[PTL 2] Japanese Patent Application Laid-Open Publication No.

SUMMARY OF INVENTION

Technical Problem

However, in the case of using the substrate described in PTL 1, it may be possible to reduce the parasitic capacitance which exists between the GND layer and the stub, but it is impossible to reduce parasitic capacitance which exists between connection terminals adjacent each other in the case that a plurality of the connection terminals are formed in parallel. As a result, the impedance mismatch due to the capacitive Moreover, in the case of using the substrate described in PTL 2, it is impossible to reduce parasitic capacitance which exists between signal terminals or between the signal terminal and the connection terminal which has the GND level electric potential.

The present invention is conceived to solve the above-mentioned problem. An object of the present invention is to provide an electronic substrate which can improve the cross talk by reducing the parasitic capacitance which exists between the connection terminals.

Solution to Problem

In order to achieve the object, an electronic substrate according to the present invention includes: a substrate member which has a shape of plane plate and whose pair of main surfaces are opposite each other; a plurality of connection terminals which are formed so as to be arranged on an edge side of the substrate member and on at least one surface out of the pair of main surfaces of the substrate member; a plurality of wirings which are connected with the plural connection terminals; and a plurality of openings arranged in an area, which exists between connection terminals adjacent each other out of the plural connection terminals and in which the connection terminals adjacent each other extend, in an extending direction of the connection terminals adjacent each other.

Moreover, structure for connector connection of an electronic substrate according to the present invention includes an electronic substrate which has a shape of plane plate, and a connector which holds an edge of the electronic substrate. The electric substrate includes: a substrate member which has a shape of plane plate and whose pair of main surfaces are opposite each other; a plurality of connection terminals which are formed so as to be arranged on an edge side of the substrate member and on at least one surface out of the pair of main surfaces of the substrate member; a plurality of wirings which are connected with the plural connection terminals; and a plurality of openings arranged in an area, which exists between connection terminals adjacent each other out of the plural connection terminals and in which the connection terminals adjacent each other extend, in an extending direction of the connection terminals adjacent each other. The connector includes connector side connection terminals which come into contact with the plural connection terminals when the connector holds the electronic substrate.

Advantageous Effects of Invention

According to the present invention, it is possible to reduce the parasitic capacitance which exists between the connection terminals, and consequently it is possible to improve the cross talk.

DESCRIPTION OF EMBODIMENTS

<First Exemplary Embodiment>

Figure 1:
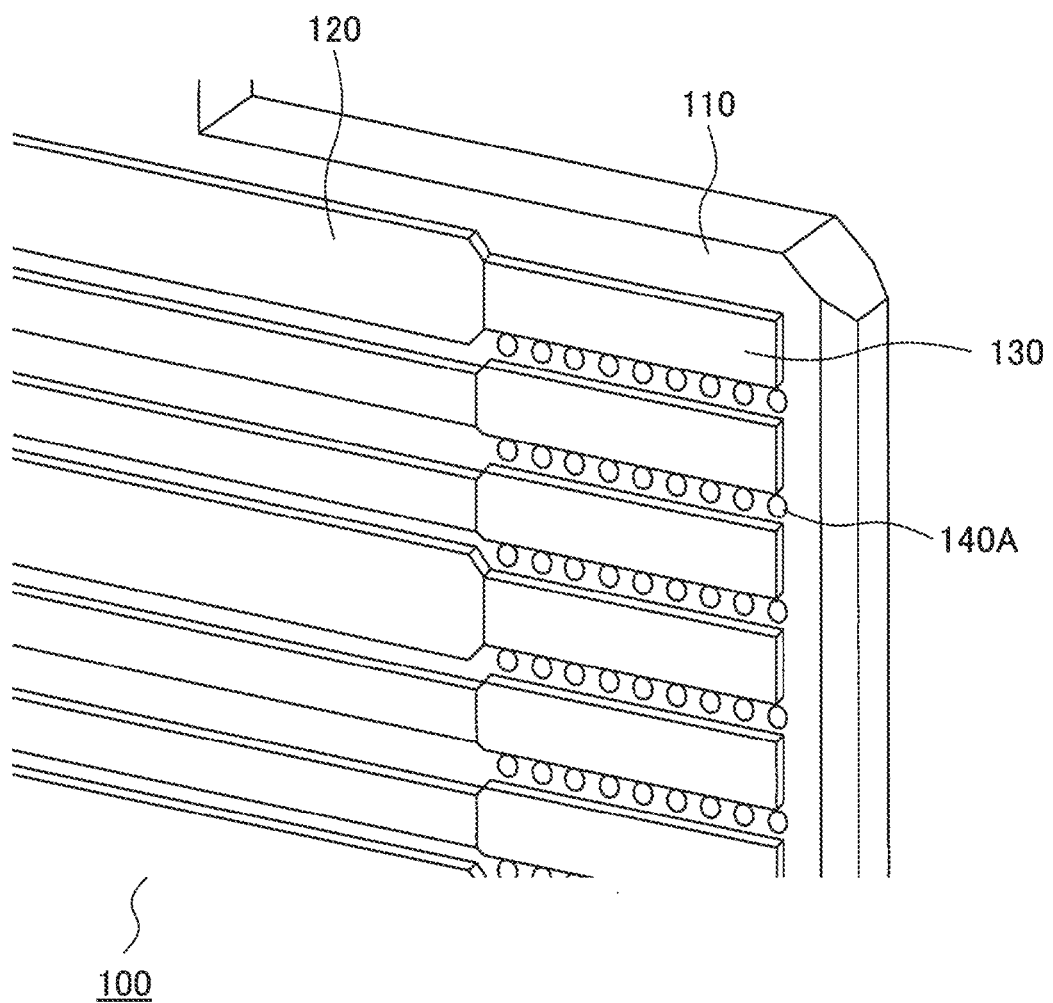
FIG. 1 is a diagram showing structure of an electronic substrate according to a first exemplary embodiment of the present invention.
Figure 2:
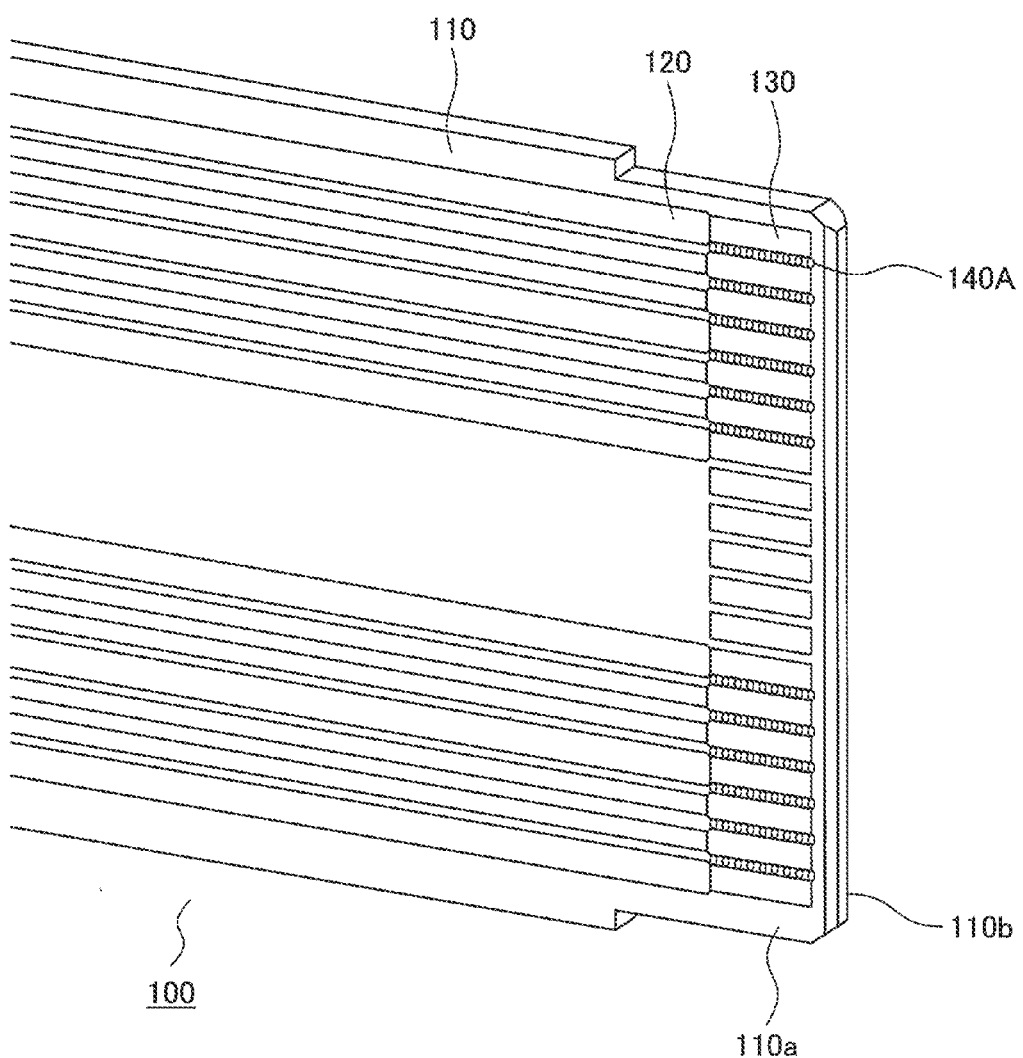
FIG. 2 is a diagram showing structure of the electronic substrate according to the first exemplary embodiment of the present invention.
Figure 3:
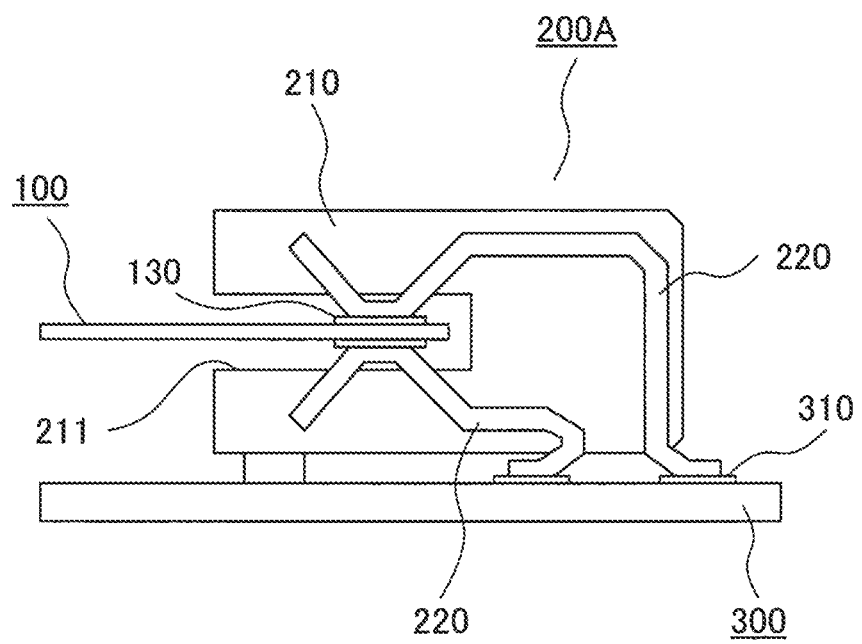
FIG. 3 is a diagram showing structure for connector connection according to the first exemplary embodiment of the present invention.
Figure 4:
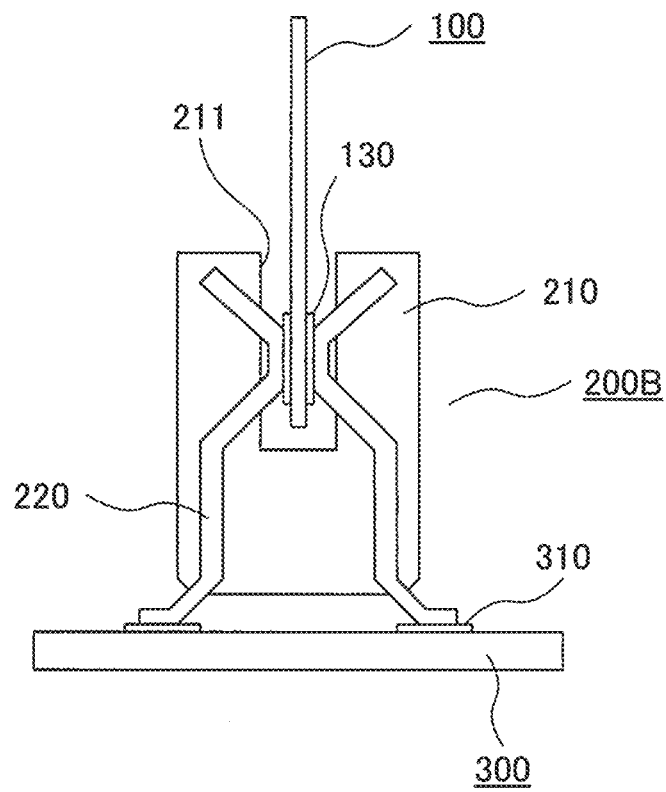
FIG. 4 is a diagram showing structure for connector connection according to the first exemplary embodiment of the present invention.

Each of FIG. 1 and FIG. 2 shows structure of an electronic substrate 100 in a first exemplary embodiment of the present invention. FIG. 3 is a diagram showing structure for connector connection which is used for connecting the electronic substrate 100 with a connector 200A, and FIG. 4 is a diagram showing structure for connector connection which is used for connecting the electronic substrate 100 with a connector 200B. In the following explanation, firstly, the structure of the electronic substrate 100 will be explained with reference to FIG. 1, and afterward the structure for connector connection of the electronic substrate 100 will be explained with reference to FIG. 3 and FIG. 4.

Firstly, details of the structure of the electronic substrate 100 will be explained with reference to FIG. 1 and FIG. 2. FIG. 1 is a diagram which enlarges an edge side of the electronic substrate 100 shown in FIG. 2 on which a connection terminal 130 is arranged. As shown in FIG. 1 and FIG. 2, the electronic substrate 100 has structure which includes a substrate member 110 which has a shape of plane plate, a wiring 120, the connection terminal 130 and a plurality of openings 140 A.

The substrate member 110, which has the shape of plane plate, includes a pair of main surfaces 110a and 110b which are opposite each other. A material, which is used usually, such as glass epoxy, polyimide, teflon (trade mark), BT (Bismaleimide Trazine) resin or the like can be used as a material of the substrate member 110. Moreover, the substrate member 110 may be made of plural layers, and for example, may include the GND layer and the power supply layer as an inner layer.

The connection terminal 130 are formed so as to be arranged on an edge side of the substrate member 110 and on at least one surface out of the pair of main surfaces 110a and 110b of the substrate member 110. Here, each of FIG. 1 and FIG. 2 exemplifies a case that the connection terminal 130 is formed on the main surface 110a. Moreover, it is possible to use the connection terminal 130, for example, as a connection terminal for signal or a connection terminal having the GND level electric potential. Moreover, it is possible to form the connection terminal 130, for example, with the electrolytic gold plating or the non-electrolytic gold plating.

The wiring 120 is connected electrically with the connection terminal 130. It is possible to use a conductive material, which is used usually, such as copper or the like as a material of the wiring 120. Moreover, the wiring 120 is used, for example, as a wiring for signal or a GND wiring.

The plural openings 140A are formed in an area, which exists between the connection terminals 130 adjacent each other and in which the connection terminals 130 adjacent each other extend, in an extending direction of the connection terminals 130 adjacent each other. Each of the plural openings 140A is a penetration type hole which penetrates between the main surface 110a and the main surface 110b. However, the present invention is not limited to the above mention. Each of the plural openings 140A may be a hole which does not penetrate between the main surface 110a and the main surface 110b.

Moreover, it is enough that the plural openings 140A are formed. By forming many openings 140A, it is possible to make relative permittivity small equivalently in the area, which exists between the connection terminals 130 adjacent each other out of the substrate member, and consequently it is possible to reduce the parasitic capacitance of the connection terminal 130 furthermore.

Moreover, it is enough that the plural openings are arranged in the area which exists between the connection terminals adjacent each other and in which the connection terminals 130 adjacent each other extend. It is desirable to determine largeness, number and a shape of the opening 140A adequately in consideration of a balance of the area which exists between the connection terminals 130 adjacent each other and in which the connection terminals 130 adjacent each other extend, and an effect of reducing the parasitic capacitance. As a method of forming the plural openings 140A, the methods of etching, drilling and punching are exemplified.

<Explanation on Structure for Connector Connection>

Next, the structure for connector connection of the electronic substrate 100 will be explained with reference to FIG. 3 and FIG. 4.

As shown in FIG. 3 and FIG. 4, the structure for connector connection according to the present invention has structure which includes the electronic substrate 100 and the connectors 200A and 200B. The connectors 200A and 200B are mounted on a circuit substrate 300. Here, structure of the electronic substrate 100 is the same as the structure which has been explained with reference to FIG. 1 and FIG. 2.

FIG. 3 exemplifies a case that the connector 200A holds the electronic substrate 100 so that the electronic substrate 100 may be parallel to the circuit substrate 300.

FIG. 4 exemplifies a case that the connector 200B holds the electronic substrate 100 so that the electronic substrate 100 may be vertical to the circuit substrate 300.

As shown in FIG. 3 and FIG. 4, each of the connectors 200A and 200B has structure which includes a housing 210 and a connector side connection terminal 220.

A slot 211, into which the edge of the electronic substrate 100 having the connector terminal 130 thereon is inserted or from which the edge of the electronic substrate is pulled out, is formed in the housing 211. The slot 211 is formed so as to match with a width of a long side of the edge of the electronic substrate 100.

A plurality of the connector side connection terminals 220 are arranged apart each other in a direction of a long side of the slot 211 in the slot 211 of the housing 210. Moreover, the connector side connection terminals 220 are arranged so as to come into contact with the plural connection terminals 130 of the electronic substrate 100 and hold the electronic substrate 100 by interposing the electronic substrate 100, when the electronic substrate 100 is inserted into the slot 211.

Moreover, the connector side connection terminal 220 penetrates a bottom of the housing 210 which exists on the circuit board 300 side, and is connected with the circuit board 300 electrically through a terminal for connector connection 310. The connector side connection terminal 220 is connected with the terminal for connector connection 310 of the circuit board 300, for example, with the soldering method.

As shown in FIG. 3 and FIG. 4, the circuit board 300, which is a board having a shape of plane plate, includes the terminal for connector connection 310. The circuit board 300 is connected electrically with the electronic substrate 100 through the connectors 200A and 200B. For example, it is possible to use a printed wiring board as the circuit board 300.

The terminal for connector connection 310 is formed on the circuit board 300, and connects the connector side connection terminal 220 and the circuit board 300 electrically.

Next, an operation related to the structure for connector connection in the present exemplary embodiment will be explained.

As shown in FIG. 3 and FIG. 4, the electronic substrate 100 is inserted into the slot 211 of a connector 200 which is mounted on the circuit substrate 300. When the electronic substrate 100 is inserted into the slot 211, the connector side connection terminals 220 come into contact with the plural connection terminals 130 of the electronic substrate 100 and holds the electronic substrate 100 by interposing the electronic substrate 100. By carrying out the above, the electronic substrate 100 is connected electrically with the circuit board 300 through the connectors 200A and 200B.

A transmission signal which flows on the electronic substrate 100 passes the connection terminal 130, the connector side connection terminal 220 and the terminal for connector connection 310, and is transferred to the circuit board 300. Reversely, a transmission signal which flows on the circuit board 300 is transferred to the electronic substrate 100 through the terminal for connector connection 310, the connector side connection terminal 220 and the connection terminal 130.

As mentioned above, the electronic substrate 100 in the first exemplary embodiment of the present invention includes the substrate member 110 which has the shape of plane plate, the wiring 120, the connection terminal 130 and the plural openings 140A. The substrate member 110 which has the shape of plane plate has the pair of main surfaces 110a and 110b which are opposite each other. The connection terminal 130 is formed so as to be arranged on the edge side of the substrate member 110 and on at least one surface out of the pair of main surfaces 110a and 110b of the substrate member 110. The wiring 120 is connected electrically with the connection terminal 130. The plural openings 140A are formed in the area, which exists between the connection terminals 130 adjacent each other and in which the connection terminals 130 adjacent each other extend, in the extending direction of the connection terminals 130 adjacent each other.

As mentioned above, in the case of the electronic substrate 100 in the first exemplary embodiment, the plural openings 140A are formed in the area, which exists between the connection terminals 130 adjacent each other and in which the connection terminals 130 adjacent each other extend, in the extending direction of the connection terminals 130 adjacent each other.

Here, characteristic impedance Z0 of the connection terminal 130 of the present exemplary embodiment is expressed by the following formula.

$$Z0 = \sqrt{(L/C)}$$

where L is inductance of the connector terminal 130, and C is a value of parasitic capacitance which exists between one connector terminal 130 and another connector terminal 130 adjacent to the one connector terminal 130. In general, as the value of parasitic capacitance C becomes large, the characteristic impedance Z0 becomes low and consequently the cross talk is caused. As a result, degradation of transmission characteristics is caused.

In contrast, the electronic substrate 100 has the structure that the plural openings 140A are formed in the area which exists between the connection terminals 130 adjacent each other and in which the connection terminals 130 adjacent each other extend. Therefore, it is possible to reduce the relative permittivity equivalently in the area existing between the connection terminals 130 adjacent each other out of the substrate member 110. The value of parasitic capacitance C, which exists between the connection terminals 130 adjacent each other, is proportional to the relative permittivity in the area existing between the connection terminals 130. Therefore, by making the relative permittivity small in the area existing between the connection terminals 130, it is also possible to make the parasitic capacitance C small.

As a result, according to the present exemplary embodiment, by reducing the parasitic capacity which exists between the connection terminals 130 adjacent each other, it is possible to restrain the characteristic impedance from being lowered, and consequently it is possible to improve the cross talk which is generated at the connection terminal 130.

Moreover, as mentioned above, each of the plural openings 140A of the electronic substrate 100 in the first exemplary embodiment of the present invention may be the hole which does not penetrate between the pair of main surfaces 110a and 110b of the substrate member 110. In this case, since each of the plural openings 140A does not penetrate between the pair of main surfaces 110a and 110b of the substrate member 110, there is no case that strength of the substrate member 110 becomes lower than a necessary strength.

Moreover, while each of the plural openings 140A is the hole which does not penetrate between the pair of main surfaces 110a and 110b of the substrate member 110, it is possible to lower the relative permittivity between the connection terminals 130 which are adjacent each other, and it is possible to reduce the parasitic capacitance which exists between the connection terminals 130 adjacent each other. As a result, it is possible to bring about an effect which is the same as the effect of the above-mentioned electronic substrate 100.

<Second Exemplary Embodiment>

Figure 5:
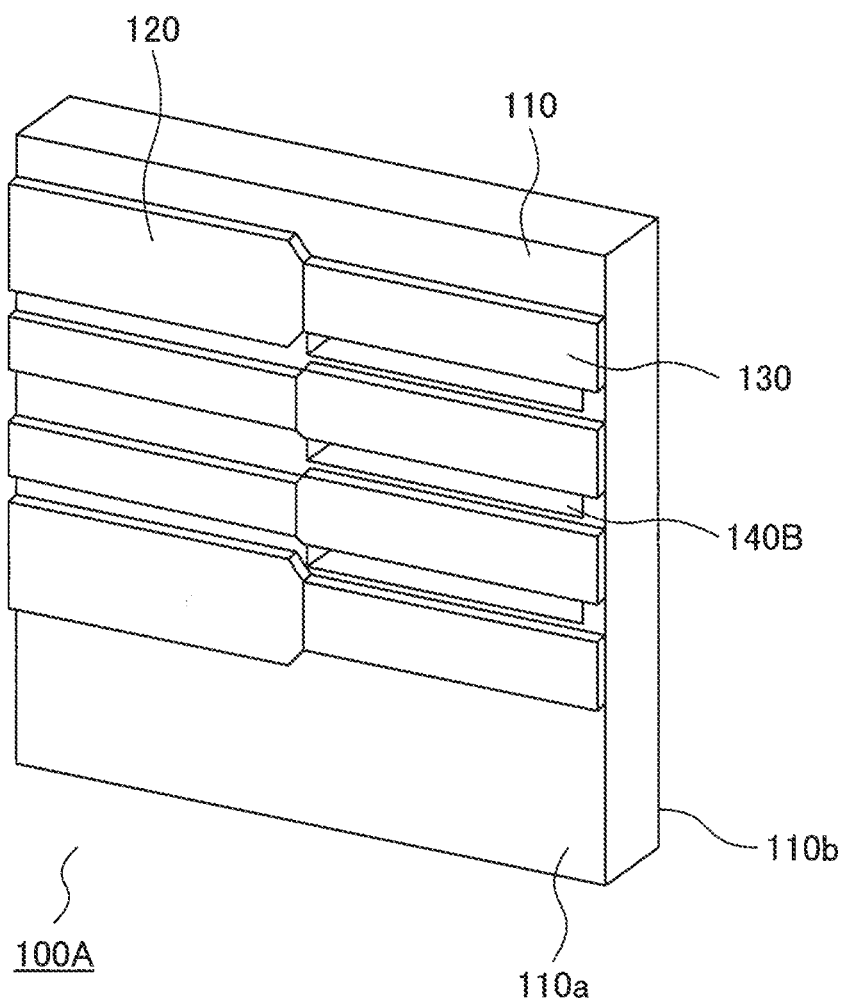
FIG. 5 is a diagram showing structure of an electronic substrate according to a second exemplary embodiment of the present invention.

With reference to FIG. 5, an electronic substrate 100A in a second exemplary embodiment of the present invention will be explained in the following. FIG. 5 is a diagram showing the electronic substrate 100A. Here, a component shown in FIG. 5, which is equivalent to the component shown in FIGS. 1 to 4, is assigned a code which is the same as the code of the component shown in FIGS. 1 to 4.

As shown in FIG. 5, the electronic substrate 100A has structure which includes the substrate member 110 having the shape of plane plate, the wiring 120, the connection terminal 130 and an opening 140B which has a shape of rectangle.

Comparing FIG. 1 and FIG. 5, FIG. 1 shows that the plural openings 140A are arranged in the area which exists between the connection terminals 130 adjacent each other and in which the connection terminals 130 adjacent each other extend. In contrast, FIG. 5 shows that the opening 140B which has the shape of rectangle is arranged in the area which exists between the connection terminals 130 adjacent each other and in which the connection terminals 130 adjacent each other extend. In this point, both of the structure shown in FIG. 1 and the structure shown in FIG. 5 are different each other. Explanation on a part of the structure shown in FIG. 5, which is equivalent to a part of the structure shown in FIG. 1 and FIG. 2, will be omitted in the following explanation.

As shown in FIG. 5, the opening 140B which has the shape of rectangle is arranged in the area, which exists between the connection terminals 130 adjacent each other out of the plural connection terminals 130 and in which the connection terminals 130 adjacent each other extend, in the extending direction of the connection terminals 130 adjacent each other.

Here, FIG. 5 exemplifies a case that the opening 140B having the shape of rectangle is a penetration type hole which is formed so as to penetrate between the pair of main surfaces 110a and 110b of the substrate member 110. However, the opening 140B which has the shape of rectangle may be a ditch which does not penetrate between the pair of main surfaces 110a and 110b of the substrate member 110.

In the case that the opening 140B having the shape of rectangle is the ditch which does not penetrate between the pair of main surfaces 110a and 110b of the substrate member 110, the opening 140B which has the shape of rectangle may be, for example, a V-shaped ditch whose width becomes narrow gradually toward an inner layer of the substrate member 110.

As a method for forming the opening 140B which has the shape of rectangle, methods of etching and drilling are exemplified. Here, the method for forming the opening 140B which has the shape of rectangle is not limited to the methods of etching and drilling, and any method is applicable as far as it is possible to make the opening have the shape of rectangle with the method. In the case that the opening 140B which has the shape of rectangle is the V-shaped ditch, the opening 140B which has the shape of rectangle can be formed by use of, for example, a router for digging the V-shaped ditch.

As mentioned above, the electronic substrate 100A in the second exemplary embodiment of the present invention includes the opening 140B which has the shape of rectangle. Since the electronic substrate 100A has the structure that the opening 140B having the shape of rectangle is formed in the area which exists between the connection terminals 130 adjacent each other and in which the connection terminals 130 adjacent each other extend, it is possible to reduce the relative permittivity equivalently in the area which exists between the connection terminals 130 out of the substrate member 110.

Therefore, by making the relative permittivity small in the area existing between the connection terminals 130, it is also possible to make the parasitic capacitance C small. As a result, according to the present exemplary embodiment, by reducing the parasitic capacity which exists between the connection terminals 130 adjacent each other, it is possible to restrain the characteristic impedance from being lowered, and consequently it is possible to improve the cross talk which is generated at the connection terminal 130.

<Third Exemplary Embodiment>

Figure 6A:
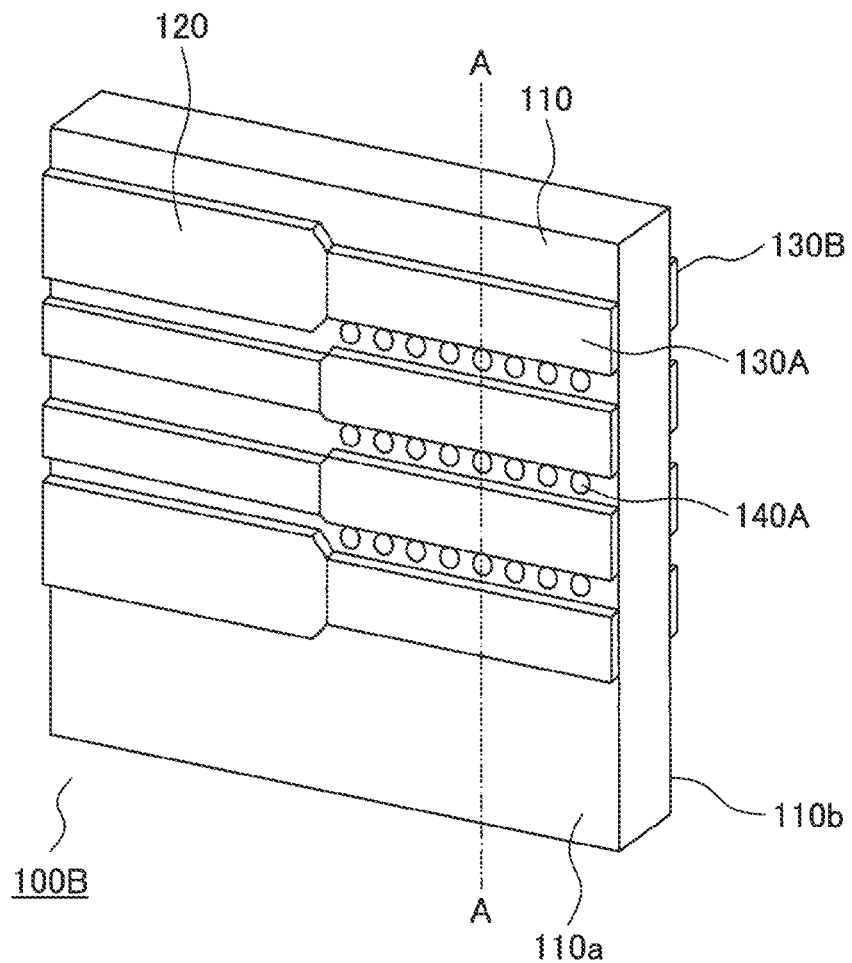
FIG. 6A is a plan view of an electronic substrate according to a third exemplary embodiment of the present invention.
Figure 6B:
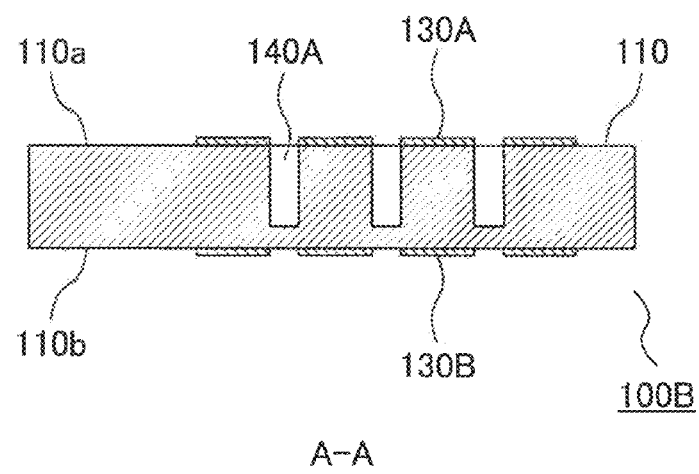
FIG. 6B is a cross section view of FIG. 6A taken from a cutting plane including a line A-A.

With reference to FIG. 6A and FIG. 6B, an electronic substrate 100B in a third exemplary embodiment of the present invention will be explained in the following.

FIG. 6A is a plan view of the electronic substrate 100B. FIG. 6B is a cross section view of FIG. 6A taken from a cutting plane including a line A-A.

Here, a component shown in FIG. 6A and FIG. 6B, which is equivalent to the component shown in FIGS. 1 to 5, is assigned a code which is the same as the code of the component shown in FIGS. 1 to 5.

As shown in FIG. 6A and FIG. 6B, the electronic substrate 100B has structure which includes the substrate member 110 which has the shape of plane plate, the wiring 120, a first connection terminal 130A, a second connection terminal 130B and the plural openings 140A.

Here, FIG. 6A and FIG. 6B are compared with FIG. 1 and FIG. 2. According to FIG. 1 and FIG. 2, the structure that the connection terminal 130 is formed so as to be arranged on the edge side of the substrate member 110 and on at least one surface out of the pair of main surfaces 110a and 110b of the substrate member 110 is adopted.

In contrast, according to FIG. 6A and FIG. 6B, the first connection terminal 130A and the second connection terminal 130B are formed so as to be arranged oppositely each other on both surfaces out of the pair of main surfaces 110a and 110b of the substrate member 110. In this point, both of the structure shown in FIG. 1 and FIG. 2, and the structure shown in FIG. FIG. 6A and FIG. 6B are different each other. Explanation on a part of the structure shown in FIG. 6A and FIG. 6B which is equivalent to a part of the structure shown in FIG. 1 and FIG. 2 will be omitted in the following explanation.

As shown in FIG. 6A and FIG. 6B, the first connection terminal 130A and the second connection terminal 130B are formed so as to be arranged on the edge side of the substrate member 110 and on the both surfaces out of the pair of main surfaces 110a and 110b of the substrate member 110.

The first connection terminal 130A is formed on one surface out of the pair of main surfaces of the substrate member 110. Each of FIG. 6A and FIG. 6B exemplifies a case that the first connection terminal 130A is arranged on the main surface 110a.

The second connection terminal 130B is formed on the other surface out of the pair of main surfaces of the substrate member 110. Each of FIG. 6A and FIG. 6B exemplifies a case that the second connection terminal 130B is arranged on the main surface 110b.

As shown in FIG. 6A and FIG. 6B, the first connection terminal 130A and the second connection terminal 130B are formed so as to be arranged oppositely each other. The first connection terminal 130A and the second connection terminal 130B are used, for example, as a connection terminal for signal or a connection terminal which has the GND level electric potential. Moreover, the first connection terminal 130A and the second connection terminal 130B can be formed, for example, with the electrolytic gold plating or the non-electrolytic gold plating.

Each of FIG. 6A and FIG. 6B exemplifies a case that each of the plural openings 140A is the hole which does not penetrate between the pair of main surfaces 110a and 110b of the substrate member 110. However, each of the plural openings 140A may be a penetration type hole which penetrates between the pair of main surfaces 110a and 110b of the substrate member 110.

Here, the connector side connection terminal 220 of the connector 200A and the connector side connection terminal 220 of the connector terminal 200B are arranged correspondingly to the connection terminal 130A and the connection terminal 130B which are formed on the main surface 110a and the main surface 110b of the substrate member 110 respectively.

As mentioned above, the first connection terminal 130A and the second connection terminal 130B of the electronic substrate 100B in the third exemplary embodiment of the present invention are formed so as to be arranged oppositely each other on the both surfaces out of the pair of main surfaces 110a and 110b of the substrate member 110 respectively. Since the first connection terminal 130A and the second connection terminal 130B of the electronic substrate 100B are formed so as to be arranged on the both surfaces out of the pair of main surfaces 110a and 110b of the substrate member 110 respectively, it is possible to mount more electronic components on the electronic substrate 100B.

Moreover, since the plural openings 140A are arranged in the electronic substrate 100B, it is possible to reduce relative permittivity equivalently in an area which exists between one first connection terminal 130A and another first connection terminal 130A adjacent to the one first connection terminal 130A. As a result, it is possible to make parasitic capacitance, which exists between the one first connection terminal 130A and the other first connection terminal 130A adjacent to the one first connection terminal 130A, small equivalently.

Furthermore, by arranging the plural openings 140A, it is possible to make parasitic capacitance, which exists between the first connection terminal 130A and the second connection terminal 130B opposite to the first connection terminal 130A, small equivalently. As a result, it is also possible to make parasitic capacitance, which exists between the first connection terminal 130A and the second connection terminal 130B opposite to the first connection terminal 130A, small.

Moreover, in place of the plural openings 140A, the opening 140B (refer to FIG. 5), which has the shape of rectangle, may be arranged in the electronic substrate 100B in the third exemplary embodiment of the present invention. Even in this case, since it is possible to reduce the relative permittivity equivalently in the area which exists between the one first connection terminal 130A and the other first connection terminal 130A adjacent to the one first connection terminal 130A, it is possible to make the parasitic capacitance, which exists between the one first connection terminal 130A and the other first connection terminal 130A adjacent to the one first connection terminal 130A, small.

Furthermore, similarly to the above-mentioned case that the plural openings 140A are arranged, by arranging the opening 140B which has the shape of rectangle, it is possible to reduce the relative permittivity equivalently in the area which exists between the first connection terminal 130A and the second connection terminal 130B opposite to the first connection terminal 130A. As a result, it is also possible to make the parasitic capacitance, which exists between the first connection terminal 130A, and the second connection terminal 130B opposite to the connection terminal 130A, small.

21 Fourth Exemplary Embodiment22

Figure 7A:
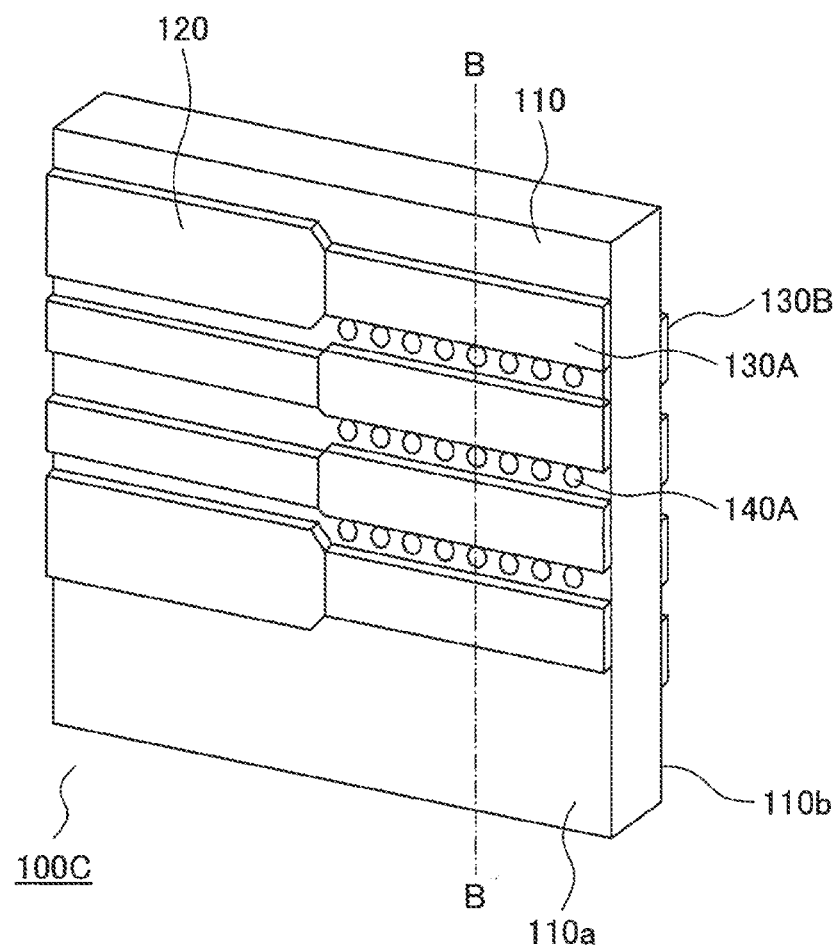
FIG. 7A is a plan view of an electronic substrate according to a fourth exemplary embodiment of the present invention.
Figure 7B:
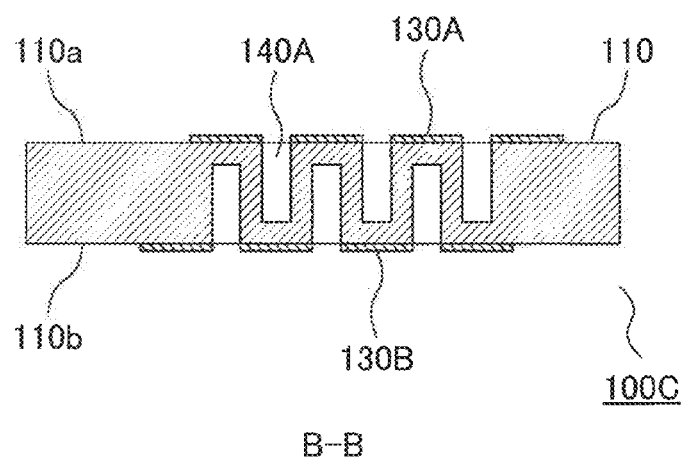
FIG. 7B is a cross section view of FIG. 7A taken from a cutting plane including a line B-B.
Figure 8:
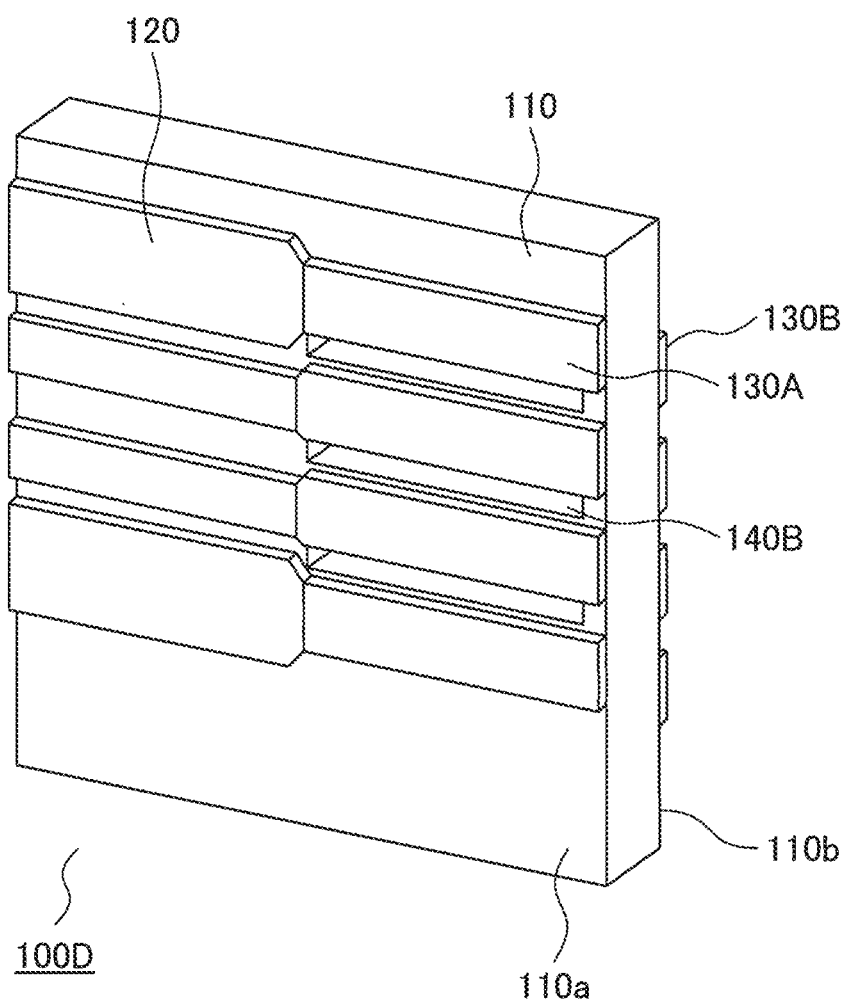
FIG. 8 is a diagram showing structure of an electronic substrate according to the fourth exemplary embodiment of the present invention.

With reference to FIG. 7A, FIG. 7B and FIG. 8, electronic substrates 100C and 100D in a fourth exemplary embodiment of the present invention will be explained in the following.

Each of FIG. 7A and FIG. 7B shows structure of the electronic substrate 100C in the fourth exemplary embodiment of the present invention. FIG. 7A is a plan view of the electronic substrate 100C which includes the plural openings 140A. FIG. 7B is a cross section view of FIG. 7A taken from a cutting plane which includes a B-B line. FIG. 8 is a diagram showing structure of the electronic substrate 100D which includes the opening 140B, which has the shape of rectangle, in place of the plural openings 140A of the electronic substrate 100C shown in FIG. 7A and FIG. 7B.

Here, a component shown in FIG. 7A, FIG. 7B and FIG. 8, which is equivalent to the component shown in FIGS. 1 to 6, is assigned a code which is the same as the code of the component shown in FIGS. 1 to 5.

As shown in FIG. 7A and FIG. 7B, the electronic substrate 100C has structure which includes the substrate member 110 which has the shape of plane plate, the wiring 120, the first connection terminal 130A, the second connection terminal 130B and the plural openings 140A.

Here, FIG. 7A and FIG. 7B are compared with FIG. 6A and FIG. 6B. According to FIG. 6A and FIG. 6B, the structure that the first connection terminal 130A and the second connection terminal 130B are formed so as to be arranged oppositely each other is adopted. In contrast, according to FIG. 7A and FIG. 7B, structure that the first connection terminal 130A and the second connection terminal 130B are formed so as not to be arranged oppositely each other is adopted. In this point, both of the structure shown in FIG. 6A and FIG. 6B and the structure shown in FIG. 7A and FIG. 7B are different each other. Explanation on a part of the structure shown in FIG. 7A and FIG. 7B which is equivalent to a part of the structure shown in FIG. 1 and FIG. 2 will be omitted in the following explanation.

As shown in FIG. 7A and FIG. 7B, the first connection terminal 130A and the second connection terminal 130B are formed so as not to be arranged oppositely each other. Each of FIG. 7A and FIG. 7B exemplifies a case that, by arranging the first connection terminal 130A and the second connection terminal 130B a half pitch apart, the first connection terminal 130A and the second connection terminal 130B are formed so as not to be arranged oppositely each other.

Since the first connection terminal 130A and the second connection terminal 130B are formed so as not to be arranged oppositely each other, the plural openings 140A are formed so as not to penetrate between the pair of main surfaces 110a and 110b of the substrate member 110.

As shown in FIG. 7A and FIG. 7B, the first connection terminal 130A and the second connection terminal 130B of the electronic substrate 100C in the fourth exemplary embodiment of the present invention are formed so as not to be arranged oppositely each other. By virtue of the above-mention structure, it is possible to arrange more openings 140 in comparison with the structure in the other exemplary embodiments of the present invention.

As a result, it is possible to reduce the relative permittivity equivalently in the area which exists between the one first connection terminal 130A and the other first connection terminal 130A adjacent to the one connection terminal 130A, and the relative permittivity in the area which exists between the first connection terminal 130A and the second connection terminal 130B opposite to the connection terminal 130A. As a result, it is possible to make parasitic capacitance, which is generated in each of the areas, small.

Moreover, in the case that the opening 140B having the shape of rectangle is arranged as shown in FIG. 8 in place of the plural openings 140A of the electronic substrate 100C, it is possible to acquire the same effect.

EXAMPLE

Next, an effect of the present invention will be explained by use of an example of the electronic substrate according to the present invention, and an example of an electronic substrate which is related to the present invention.

Figure 9:
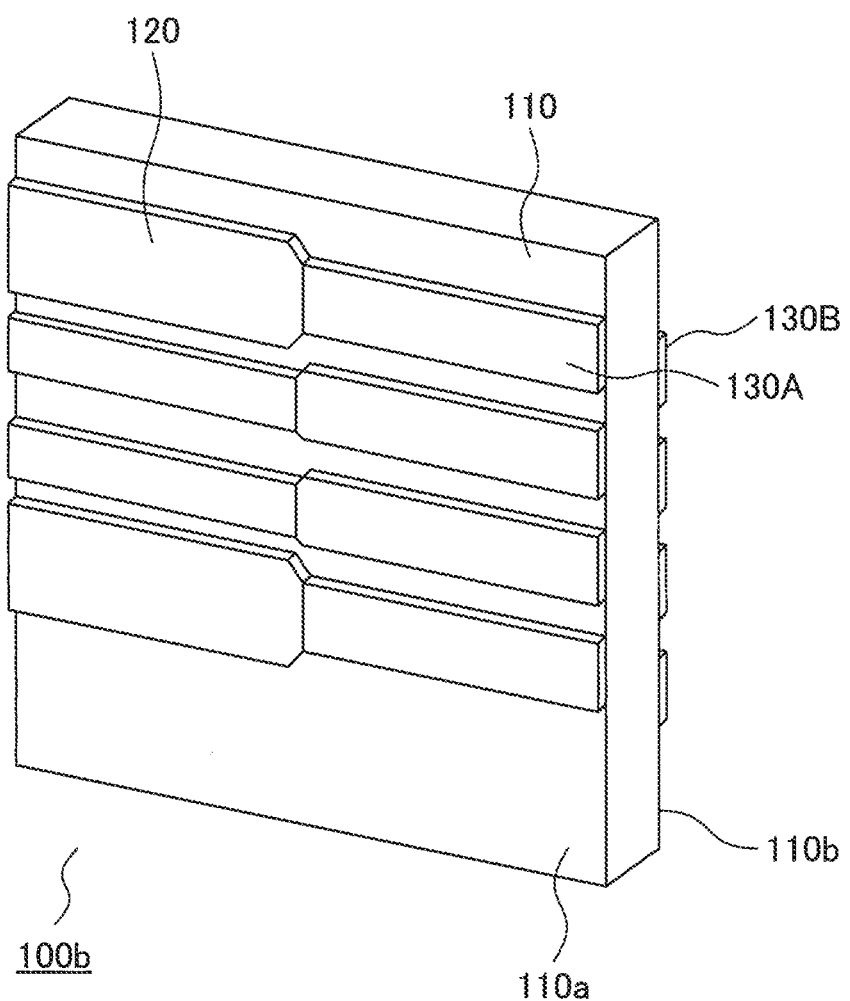
FIG. 9 is a diagram showing structure of an electronic substrate according to a related art.

An example of the electronic substrate 100D in the fourth exemplary embodiment of the present invention will be explained as an example 1. An example of the electronic substrate 100C in the fourth exemplary embodiment of the present invention will be explained as an example 2. Moreover, an example of an electronic substrate 100b which has structure shown FIG. 9 will be explained as an example for comparison. FIG. 9 is a diagram showing the structure of the electronic substrate 100b related to the present invention.

Figure 10:
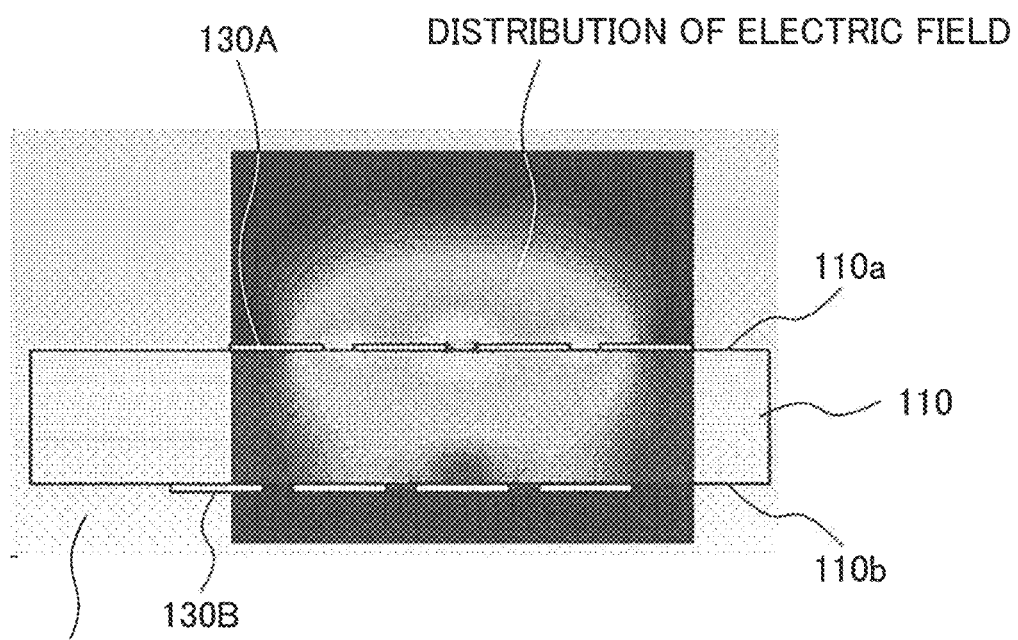
FIG. 10 is a diagram showing an analysis result on distribution of electric field in an example for comparison.

FIG. 10 shows a simulator's analysis result on distribution of electric field which is caused by parasitic capacitance generated at the connection terminals 130A and 130B of the electric substrate 100b in the example for comparison.

Figure 11:
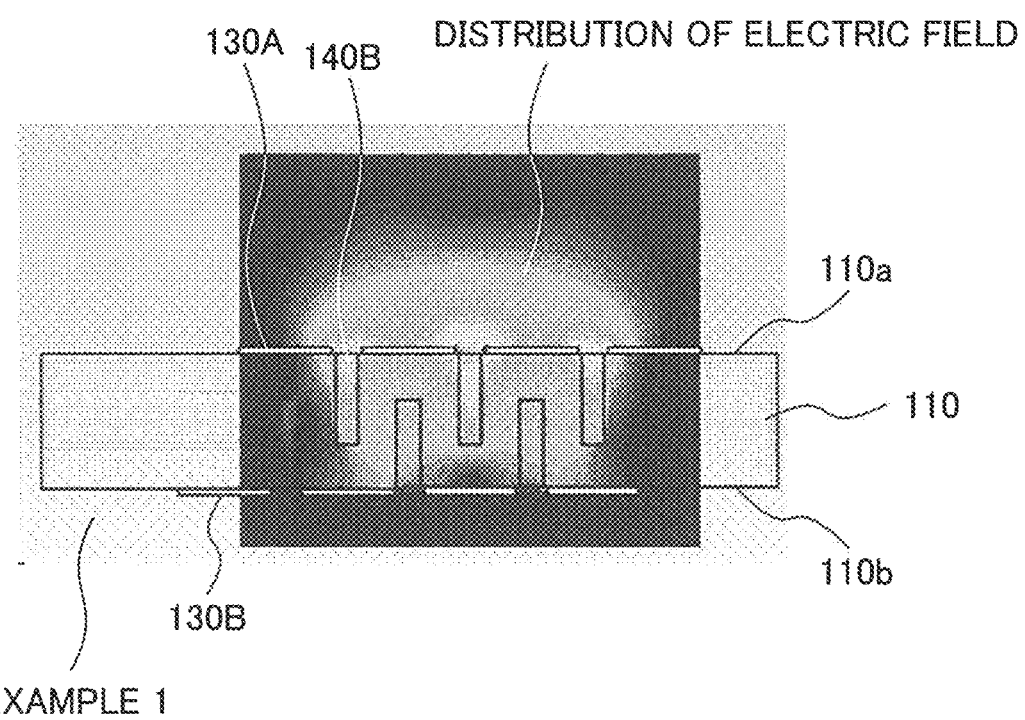
FIG. 11 is a diagram showing an analysis result on distribution of electric field in an example 1.

FIG. 11 shows a simulator's analysis result on distribution of electric field which is caused by parasitic capacitance generated at the first connection terminal 130A and the second connection terminal 130B in the example 1.

Figure 12:
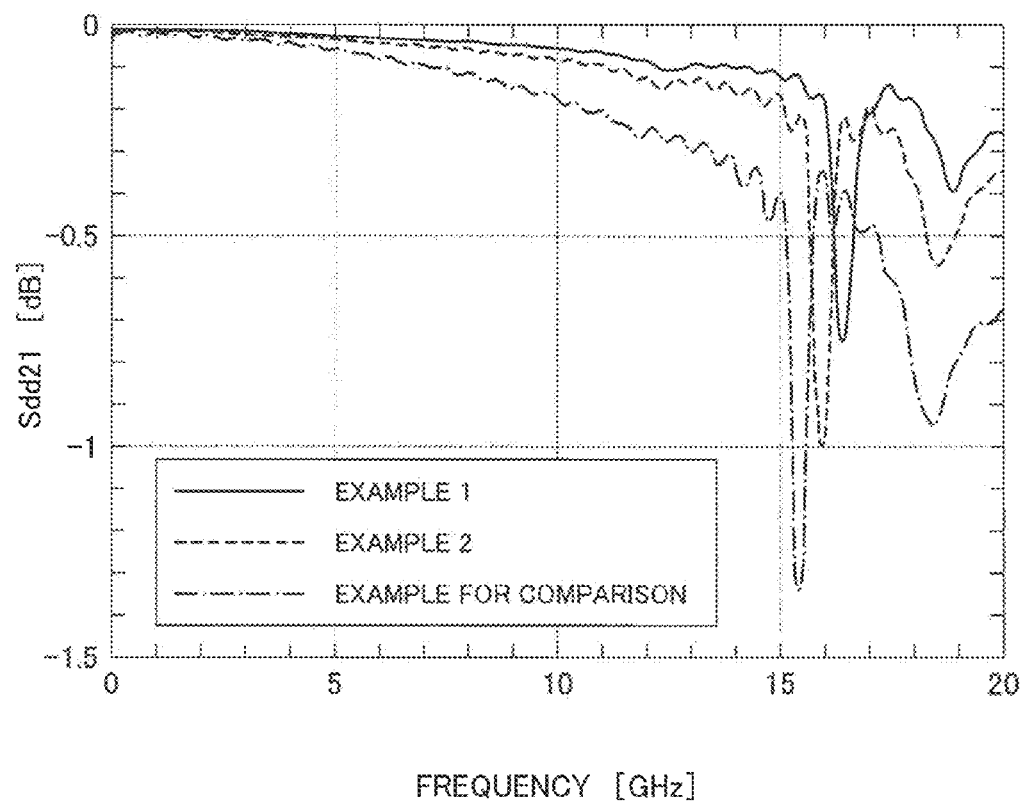
FIG. 12 is a diagram showing analysis results on scatter parameter of cross talk in the example 1, an example 2 and the example for comparison.

FIG. 12 shows analysis results on scatter parameter in the example 1, the example 2 and the example for comparison.

Next, execution conditions of the example 1, the example 2 and the example for comparison, which are used in the present example, will be explained in the following.

Example 1

As mentioned above, the example 1 is corresponding to the electronic substrate 100D (refer to FIG. 8) in the fourth exemplary embodiment of the present invention. A glass epoxy member (relative permittivity is 3.8), whose thickness, that is, thickness between the pair of main surfaces 110a and 110b is 1 mm, is used as the substrate member 110. A connection terminal, which is made of the gold plating copper alloy and whose length of a short side is 0.6 mm and whose thickness is 43 μm, is used as the first connection terminal 130A and the second connection terminal 130B. A distance between one connection terminal and another connection terminal, which is adjacent to the one connection terminal, is set to be 0.2 mm. The opening 140B is set so as to have a shape of rectangle whose length of a long side is 2.25 mm and whose length of a short side is 0.15 mm, and to have a depth of 0.58 mm.

Example 2

As mentioned above, the example 2 is corresponding to the electronic substrate 100C (refer to FIG. 7A and FIG. 7B) in the fourth exemplary embodiment of the present invention. In comparison with the example 1, the example 2 is different from the example 1 in a point that the plural openings 140A are arranged in the example 2 in place of the opening 140B having the shape of rectangle which is used in the example 1. Each of the plural openings 140A is set so as to have a diameter of 0.15 mm, and a depth of 0.58 mm. Another condition is the same as one of the example 1.

Example for Comparison

Figure 13:
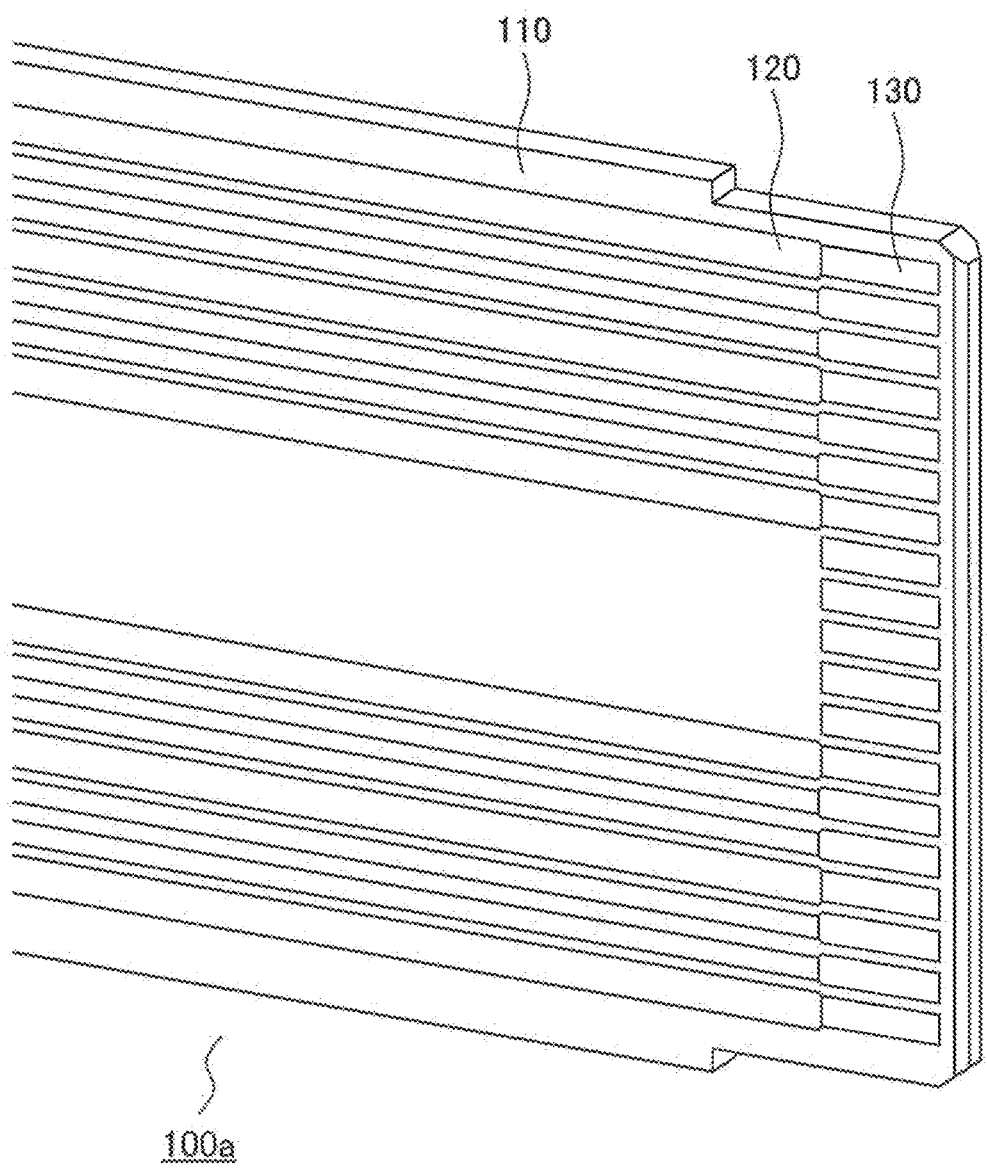
FIG. 13 is a diagram showing structure of an electronic substrate according to a related art.
Figure 14:
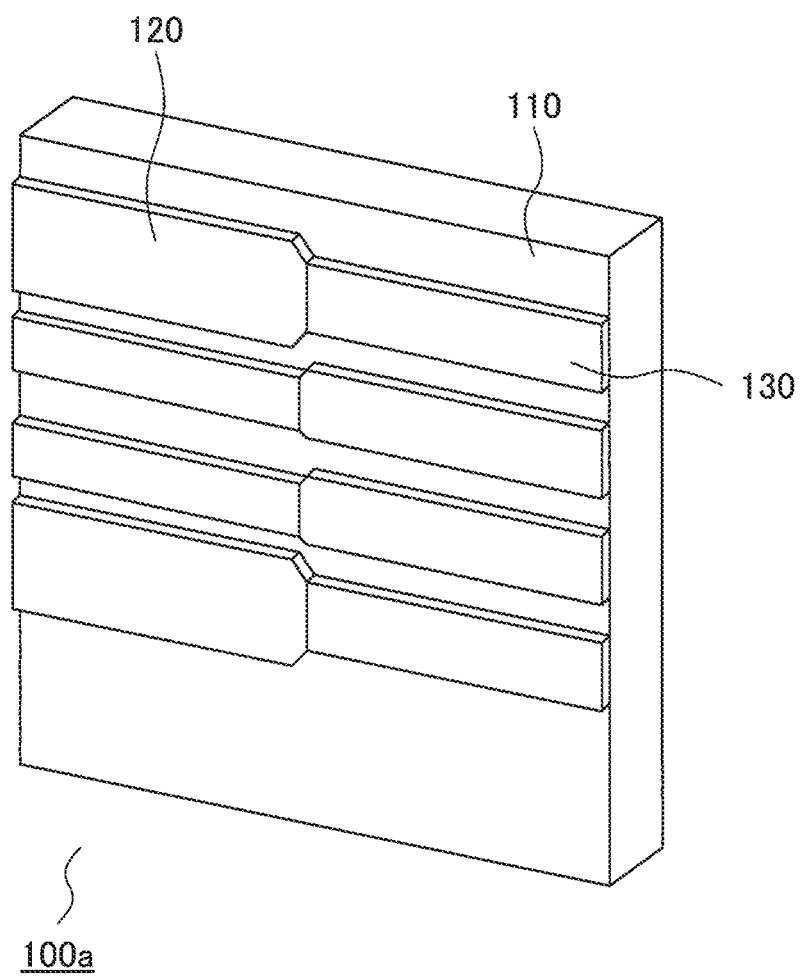
FIG. 14 is a diagram showing structure of an electronic substrate according to a related art.

The example for comparison, which is the electronic substrate 100b used for comparison with the electronic substrates in the examples 1 and 2, has structure shown in FIG. 9. The example for comparison is related to the electronic substrate 100a (refer to FIG. 13 and FIG. 14) of the related art of the present invention. The electronic substrate 100a according to the example for comparison has structure that one combination of the connector terminal 130 and the wiring 120 is arranged on one main surface out of a pair of main surfaces of the electronic substrate 100a, and similarly another combination of the connector terminal 130 and the wiring 120 is arranged on the other main surface opposite to the one main surface (refer to FIG. 9 and FIG. 10).

Moreover, as shown in FIG. 9 and FIG. 10, by arranging the connector terminals 130A and 130B, which are on the electronic substrate 100b corresponding to the example for comparison, a half pitch apart each other, the connector terminals 130A and 130B are formed so as not to be arranged oppositely each other. In comparison with the example 1, the example for comparison is different from the example 1 in a point that the opening 140B having the shape of rectangle, which is used in the example 1, is not arranged in the example for comparison. Another condition is the same as one of the example 1.

[Evaluation on Distribution of Electric Field]

Next, with reference to FIG. 10 and FIG. 11, expansion of distribution of electric field due to the parasitic capacitance in the example 1 is compared with expansion of distribution of electric field in the example for comparison. The distribution of electric field due to the parasitic capacitance in the example 1 shown in FIG. 11 has the narrow expansion in comparison with the distribution of electric field in the example for comparison shown in FIG. 10.

[Evaluation of Scatter Parameter of Cross Talk]

With reference to FIG. 12, evaluation results on scatter parameter in the example 1, the example 2 and the example for comparison are compared. As shown in FIG. 12, in the case of the example for comparison, a peak value of the cross talk is −1.3 db around 5.5 GHz. On the other hand, in the case of the example 1, a peak value of the cross talk is −0.7 db around 16.5 GHz, and in the case of the example 2, a peak value of the cross talk is −1.0 db around 16 GHz. Accordingly, in the case of the example 1 and the example 2 which include the opening, the cross talk is improved in comparison with the example for comparison which does not include the opening.

[Summary]

According to the above-mentioned measurement result, it is possible to reduce the parasitic capacitance which exists between the connection terminals of the electronic substrate by arranging the opening, and consequently it is possible to improve the cross talk.

With this, the present invention has been explained on the basis of the exemplary embodiment. The exemplary embodiment is merely exemplified, and the invention according to the present application is not limited to the above-mentioned exemplary embodiment. As far as not departing from the gist of the invention according to the present application, various changes, additions/deletions, and combinations may be added to the above-mentioned exemplary embodiment.

This application is based upon and claims the benefit of priority from Japanese Patent Application No. 2012-275669, filed on Dec. 18, 2012, the disclosure of which is incorporated herein in its entirety by reference.

REFERENCE SIGNS LIST 100 electronic substrate
100*a* electronic substrate
100*b* electronic substrate
100A electronic substrate
100B electronic substrate
100C electronic substrate
100D electronic substrate
110 substrate member
110*a* a pair of main surfaces
110*b* a pair of main surfaces
120 wiring
130 connection terminal
130A first connection terminal
130B second connection terminal
140A a plurality of openings
140B opening which has shape of rectangle
200A connector
200B connector
210 housing
220 connector side connection terminal
300 circuit board
310 terminal for connector connection

The invention claimed is:

1. An electronic substrate, comprising:
a substrate member which has a shape of a plane plate and a pair of main surfaces that are opposite each other;
a plurality of first connection terminals disposed on an edge side of the substrate member and on one surface out of the pair of main surfaces of the substrate member;
a plurality of second connection terminals disposed on the edge side of the substrate member, which are formed on another surface of the pair of main surfaces of the substrate member;
a plurality of wirings which are connected with the plurality of first connection terminals or the plurality of second connection terminals; and
a plurality of holes defined in an area, which does not penetrate the pair of main surfaces, which exists between connection terminals adjacent each other out of the plurality of first connection terminals or the plurality of second connection terminals, and in which the connection terminals adjacent each other extend, in an extending direction of the first connection terminals or the second connection terminals, adjacent each other,
wherein the plurality of first connection terminals and the plurality of second connection terminals are disposed to not be opposite each other, and
the bottom of the plurality of holes is disposed opposite the plurality of first connection terminals or the plurality of second connection terminals.

2. A structure for a connector connection, comprising:
an electronic substrate which has a shape of a plane plate; and
a connector which holds an edge of the electronic substrate,
wherein the electronic substrate comprises:
a substrate member which has a shape of plane plate and whose pair of main surfaces are opposite each other,
a plurality of first connection terminals disposed on an edge side of the substrate member and on one surface out of the pair of main surfaces of the substrate member,
a plurality of second connection terminals disposed on the edge side of the substrate member, which are formed on another surface of the pair of main surfaces of the substrate member,
a plurality of wirings which are connected with the plurality of first connection terminals, or the plurality of second connection terminals, and
a plurality of holes defined in an area, which does not penetrate the pair of main surfaces, which exists between connection terminals adjacent each other out of the plurality of first connection terminals or the plurality of second connection terminals, and in which the connection terminals adjacent each other extend, in an extending direction of the first connection terminals or the second connection terminals adjacent each other, and
wherein the connector includes connector side connection terminals which come into contact with the plurality of first and second connection terminals when the connector holds the electronic substrate,
wherein the plurality of first connection terminals and the plurality of second connection terminals are disposed to not be opposite each other, and
the bottom of the plurality of holes is disposed opposite the plurality of first connection terminals or the plurality of second connection terminals.

* * * * *